(12) United States Patent
Dutta et al.

(10) Patent No.: US 10,879,107 B2
(45) Date of Patent: Dec. 29, 2020

(54) METHOD OF FORMING BARRIER FREE CONTACT FOR METAL INTERCONNECTS

(71) Applicant: International Business Machines Corporation, Armonk, NY (US)

(72) Inventors: Ashim Dutta, Menands, NY (US); Ekmini Anuja De Silva, Slingerlands, NY (US); Jennifer Church, Troy, NY (US); Luciana Meli Thompson, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/180,834

(22) Filed: Nov. 5, 2018

(65) Prior Publication Data

US 2020/0144107 A1    May 7, 2020

(51) Int. Cl.
*H01L 21/768*    (2006.01)
*H01L 23/528*    (2006.01)
(Continued)

(52) U.S. Cl.
CPC .. *H01L 21/76807* (2013.01); *H01L 21/76816* (2013.01); *H01L 21/76831* (2013.01);
(Continued)

(58) Field of Classification Search
CPC ......... H01L 21/76807; H01L 21/76816; H01L 21/76831; H01L 21/76814;
(Continued)

(56) References Cited

U.S. PATENT DOCUMENTS 7,368,377 B2 * 5/2008 Whelan .................. B82Y 30/00
                                                        438/643
7,696,085 B2 * 4/2010 Li ........................ H01L 21/0337
                                                        257/E21.219
(Continued)

OTHER PUBLICATIONS

R. Chen et al., "Achieving Area-Selective Atomic Layer Deposition on Patterned Substrates by Selective Surface Modification," Applied Physics Letters, May 2005, 4 pages, vol. 86, No. 19.
(Continued)

*Primary Examiner* — Dao H Nguyen
(74) *Attorney, Agent, or Firm* — Abdy Raissinia; Ryan, Mason & Lewis, LLP

(57) ABSTRACT

A method includes forming a first insulating layer having one or more vias formed in at least a portion of the first insulating layer. The vias are filled with a first metallic material. A cap layer is deposited on a top surface of the first insulating layer and a top surface of the one or more vias and a second insulating layer is deposited on a top surface of the cap layer. One or more openings are formed in the second insulating layer and the cap layer. A self-assembled monolayer is formed on an exposed top surface of the first metallic material in the one or more vias. A barrier layer is formed on at least the exposed surface of the one or more openings. The self-assembled monolayer is removed and the one or more openings are filled with a second metallic material.

20 Claims, 7 Drawing Sheets

(51) Int. Cl.
*H01L 23/532* (2006.01)
*H01L 23/522* (2006.01)

(52) U.S. Cl.
CPC ........ *H01L 23/528* (2013.01); *H01L 23/5226* (2013.01); *H01L 23/53223* (2013.01); *H01L 23/53238* (2013.01); *H01L 23/53266* (2013.01)

(58) Field of Classification Search
CPC ......... H01L 21/76844; H01L 21/76811; H01L 23/528; H01L 23/53238; H01L 23/53266; H01L 23/5226; H01L 23/53223
USPC ......... 257/774, 751, 758, E21.171, E21.576, 257/E21.579, E21.582, E21.584, E23.145, 257/E23.16, E23.162, E23.167; 438/627, 438/638, 641, 643, 653, 654
See application file for complete search history.

(56) References Cited

U.S. PATENT DOCUMENTS

| | | | |
|---|---|---|---|
| 7,829,150 B2 | 11/2010 | Engstrom et al. | |
| 9,589,896 B2* | 3/2017 | Armini | H01L 21/76847 |
| 9,685,404 B2* | 6/2017 | Bao | H01L 21/76805 |
| 9,842,804 B2* | 12/2017 | Wang | H01L 21/76807 |
| 10,283,404 B2* | 5/2019 | Na | H01L 21/76843 |
| 10,395,986 B1* | 8/2019 | Briggs | H01L 21/76879 |
| 10,497,613 B2* | 12/2019 | Chawla | H01L 21/76834 |
| 2005/0020058 A1* | 1/2005 | Gracias | B82Y 30/00 438/643 |
| 2006/0128142 A1* | 6/2006 | Whelan | B82Y 30/00 438/638 |
| 2008/0274282 A1 | 11/2008 | Bent et al. | |
| 2009/0081827 A1 | 3/2009 | Yang et al. | |
| 2009/0140345 A1 | 6/2009 | Zhu | |
| 2009/0238990 A1 | 9/2009 | Dasgupta et al. | |
| 2015/0380302 A1* | 12/2015 | Mountsier | H01L 21/76831 438/654 |
| 2017/0350004 A1 | 12/2017 | Kaufman-Osborn et al. | |

OTHER PUBLICATIONS

S.N. Chopra et al., "Selective Growth of Titanium Nitride on HfO2 Across Nanolines and Nanopillars," Chemistry of Materials (CM), Jul. 2016, pp. 4928-4934, vol. 28, No. 14.

C. Cummins et al., "Enabling Large-Area Selective Deposition on Metal-Dielectric Patterns Using Polymer Brush Deactivation," The Journal of Physical Chemistry, Jun. 2018, pp. 14698-14705, vol. 122, No. 26.

H. Deligianni et al., "Direct Copper Electrodeposition on Ruthenium Barrier," The Electrochemical Society (ECS), 2005, 1 page.

A. Haider et al., "Area-Selective Atomic Layer Deposition Using an Inductively Coupled Plasma Polymerized Fluorocarbon Layer: A Case Study for Metal Oxides," The Journal of Physical Chemistry, Nov. 2016, pp. 26393-26401, vol. 120, No. 46.

A. Haider et al., "Nanoscale Selective Area Atomic Layer Deposition of TiO2 Using E-Beam Patterned Polymers," Royal Society of Chemistry (RSC) Advances, Apr. 2016, pp. 106109-106119, vol. 6, No. 108.

F.S.M. Hashemi et al., "Selective Deposition of Dielectrics: Limits and Advantages of Alkanethiol Blocking Agents on Metal-Dielectric Patterns," Applied Materials & Interfaces, Nov. 2016, pp. 33264-33272, vol. 8, No. 48.

M. He et al., "Mechanism of Co Liner as Enhancement Layer for Cu Interconnect Gap-Fill," Journal of the Electrochemical Society (ECS), Jun. 2013, pp. D3040-D3044, vol. 160, No. 12.

B. Kang et al., "Study of Selective Deposition of TaN Thin Films on OTS Patterned Si(100) Substrates," Journal of Physics: Conference Series, 2008, 5 pages, vol. 100.

L. Lecordier et al., "Vapor-Deposited Octadecanethiol Masking Layer on Copper to Enable Area Selective Hf3N4 Atomic Layer Deposition on Dielectrics Studied by In Situ Spectroscopic Ellipsometry," Journal of Vacuum Science & Technology, May/Jun. 2018, 9 pages, vol. 36, No. 3.

A. Mameli et al., "Area-Selective Atomic Layer Deposition of In2O3:H Using a μ-Plasma Printer for Local Area Activation," Chemistry of Materials (CM), Jan. 2017, pp. 921-925, vol. 29, No. 3.

R.J. Wojtecki et al., "Reactive Monolayers in Directed Additive Manufacturing—Area Selective Atomic Layer Deposition," Journal of Photopolymer Science and Technology, May 2018, pp. 431-436, vol. 31, No. 3.

W. Zhang et al., "Effect of Substrate Composition on Atomic Layer Deposition Using Self-Assembled Monolayers as Blocking Layers," Journal of Vacuum Science & Technology A (JVSTA), Jan./Feb. 2016, 15 pages, vol. 34, No. 1.

I. Zyulkov et al., "Selective Ru ALD as a Catalyst for Sub-Seven-Nanometer Bottom-Up Metal Interconnects," ACS Applied Materials & Interfaces, Sep. 13, 2017, pp. 31031-31041, vol. 9, No. 36.

H. Shimizu et al., "Atomic Layer Deposited Co(W) Film as a Single-Layered Barrier/Liner for Next-Generation Cu-Interconnects," Japanese Journal of Applied Physics, May 21, 2012, vol. 51, No. 5SW.

* cited by examiner

US 10,879,107 B2

METHOD OF FORMING BARRIER FREE CONTACT FOR METAL INTERCONNECTS

BACKGROUND

This disclosure relates generally to integrated circuits (IC), and more particularly to semiconductor ICs, and methods for their construction.

With the current trends in IC miniaturization, and increasingly smaller critical dimensions, it is desirable in semiconductor device technology to integrate many different functions on a single chip. In the IC chip fabrication industry, there are three sections referred to in a typical IC chip build: front end of the line (FEOL), back end of the line (BEOL) and the section that connects those two together, the middle of the line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

The FEOL transistor devices are typically processed using single crystal and poly-crystalline silicon. The BEOL interconnects are typically made of multiple metals; the bulk of the conductor is copper. If copper diffuses into the FEOL silicon-based devices, it can cause shorting or alter sensitive transistor characteristics and render the semiconductor useless. This is the reason for the MOL connection. BEOL generally begins when the first layer of metal is deposited on the wafer. BEOL includes contacts, insulating layers (dielectrics), metal levels, and bonding sites for chip-to-package connections.

SUMMARY

According to an exemplary embodiment of the present invention, a method for fabricating a semiconductor device includes forming a first insulating layer having one or more vias formed in at least a portion of the first insulating layer, wherein the one or more vias are filled with a first metallic material. The method further comprises forming a cap layer on a top surface of the first insulating layer and a top surface of the one or more vias formed in at least a portion of the first insulating layer. The method further comprises forming a second insulating layer on a top surface of the cap layer. The method further comprises forming one or more openings in the second insulating layer and the cap layer and exposing at least a portion of a top surface of the first metallic material in the one or more vias. The method further comprises forming a self-assembled monolayer of a material on the exposed top surface of the first metallic material in the one or more vias. The method further comprises forming a barrier layer on at least an exposed surface of the one or more openings. The method further comprises removing the self-assembled monolayer to expose the top surface of the first metallic material in the one or more vias.

According to an exemplary embodiment of the present invention, a semiconductor structure includes a first insulating layer having one or more vias in at least a portion of the first insulating layer, wherein the one or more vias contain a first metallic material. The semiconductor structure further comprises a cap layer disposed on a top surface of the first insulating layer and a top surface of the one or more vias. The semiconductor structure further comprises a second insulating layer disposed on a top surface of the cap layer. The semiconductor structure further comprises one or more openings in the second insulating layer and the cap layer. The semiconductor structure further comprises a self-assembled monolayer of a material disposed on an exposed top surface of the first metallic material in the one or more vias. The semiconductor structure further comprises a barrier layer disposed on at least an exposed surface of the one or more openings.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
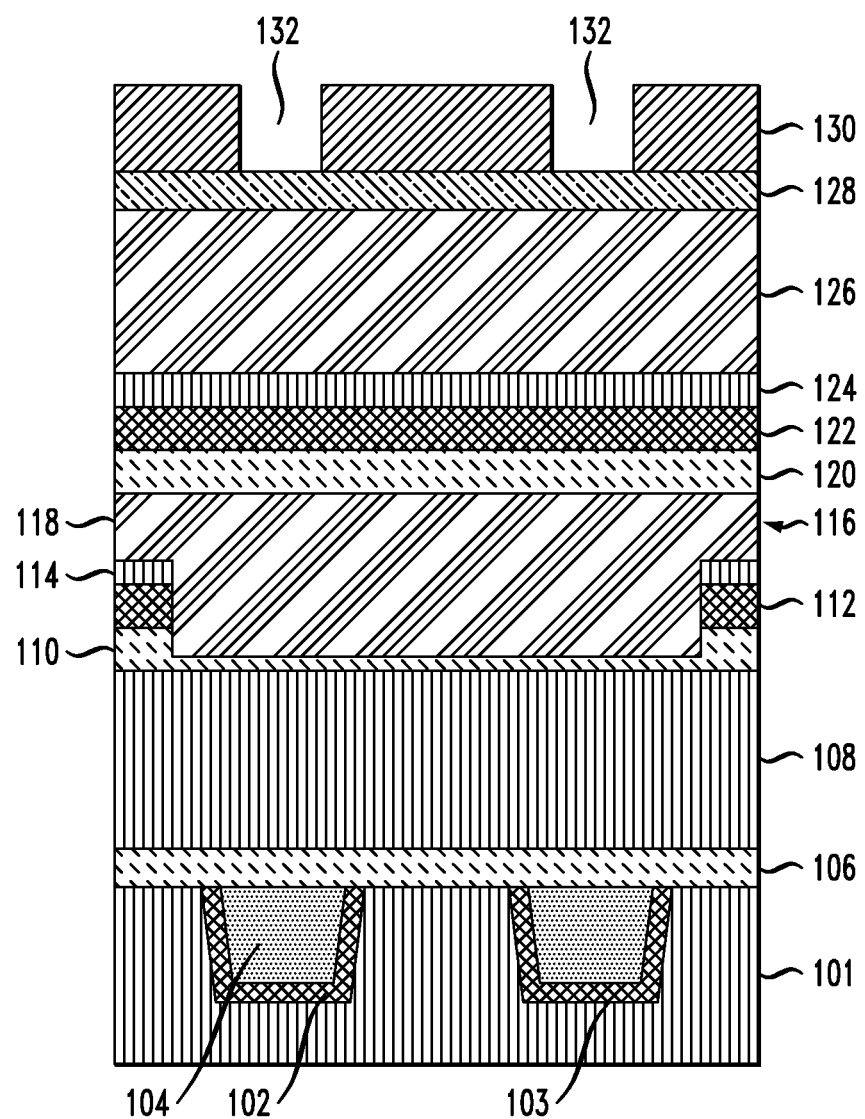
FIG. 1 is a cross-sectional view illustrating a BEOL semiconductor structure for use in a method of manufacturing a semiconductor device, according to an exemplary embodiment of the present invention.

Exemplary embodiments of the invention will now be discussed in further detail with regard to integrated circuits and a method of manufacturing the IC, and more particularly to a barrier free contact for BEOL metal interconnects and MOL metal interconnects using selective deposition of a barrier liner. High contact resistance between multi-level contacts in BEOL metal interconnects is a major hurdle for scaling due to highly resistive barrier liners (e.g., titanium nitride (TiN), tantalum nitride (TaN), etc.). For MOL metal interconnects, the use of cobalt allows reduction of TiN barrier thicknesses. However, it is still not sufficient to meet future contact resistance requirements due to the use of a highly resistive barrier liner. Thus, embodiments described herein provide a barrier free contact formed in metal interconnects.

It is to be understood that the various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. Also, in the figures, the illustrated scale of one layer, structure, and/or region relative to another layer, structure, and/or region is not necessarily intended to represent actual scale.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

The semiconductor devices and methods for forming same in accordance with embodiments of the present invention can be employed in applications such as, for example, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

Illustrative embodiments for forming a barrier free contact for metal interconnects in a semiconductor device will be described below with reference to FIGS. 1-15.

For example, according to a first embodiment, FIG. 1 illustrates a schematic cross-sectional side view of a semiconductor structure 100 for use in forming a barrier free contact for BEOL metal interconnects in a semiconductor device. For the purpose of clarity, several fabrication steps leading up to the production of semiconductor structure 100 as illustrated in FIG. 1 are omitted. In other words, semiconductor structure 100 does not necessarily start out in the form illustrated in FIG. 1, but may develop into the illustrated structure over one or more well-known processing steps which are not illustrated but are well-known to those of ordinary skill in the art.

As shown in FIG. 1, the semiconductor structure 100 comprises a first insulating layer 101. First insulating layer 101 includes any suitable low-k dielectric material such as, for example, silicon oxide, hydrogenated silicon carbon oxide (SiCOH), SiCH, SiCNH, or other types of silicon based low-k dielectrics (e.g., k less than about 4.0), porous dielectrics, or known ultra-low-k (ULK) dielectric materials (e.g., k less than about 2.5). Insulating layer 101 further includes via contacts 103 formed in at least a portion of first insulating layer 101. Via contacts 103 have a diffusion barrier/liner layer 102 formed on the sidewalls and on an exposed surface of insulating layer 101 and is filled with a metallic material 104.

In one embodiment, the via contacts 103 are formed by etching a via in at least a portion of first insulating layer 101, lining the via with a diffusion barrier/liner layer 102 and filling the via with a first metallic material 104. The diffusion barrier/liner layer 102 can be formed from, for example, TiN, TaN, and ruthenium (Ru). Suitable metallic material 104 includes, for example, aluminum (Al), tungsten (W), copper (Cu) or cobalt (Co). The diffusion barrier/liner material 102 and metallic material 104 can be conformally deposited using known methods such as atomic layer deposition (ALD), chemical vapor deposition (CVD), physical vapor deposition (PVD), electroplating, or electroless plating. A chemical mechanical planarization (CMP) process is performed to remove the overburden of the diffusion barrier/liner material and metallic material used to fill the via hole, and to planarize the structure surface prior to deposition of the dielectric cap layer.

A cap layer 106 overlies the top surface of first insulating layer 101 and vias 103. The cap layer 106 can be any suitable dielectric layer. In one embodiment, cap layer 106 is a dielectric layer such as an NBLoK (nitrogen-doped silicon carbide) layer. A second insulating layer 108 overlies the top surface of dielectric cap layer 106. Second insulating layer 108 can be of any suitable low-k dielectric material as described above for first insulating layer 101. In one embodiment, dielectric cap layer 106 can have a thickness ranging from about 20 to about 100 nanometers (nm). In one embodiment, second insulating layer 108 can have a thickness ranging from about 40 to about 1000 nm.

A first sacrificial dielectric layer 110 (e.g., a sacrificial nitride spacer) overlies the top surface of the second insulating layer 108. A first metallic hardmask layer 112 overlies a portion of first sacrificial dielectric layer 110, and a first oxide layer 114 overlies a portion of metallic hardmask layer 112. Suitable materials for the first metallic hardmask layer 112 include, for example, TiN, TiOx, TaN, AlOx, HfOx etc. The first sacrificial dielectric layer 110, first metallic hardmask layer 112 and first oxide layer 114 may be formed using known deposition techniques, such as, for example, CVD, PVD, PECVD, ALD, or spin on deposition, followed by a standard planarization process (e.g., CMP) to planarize the upper surfaces prior to forming trench 116.

Trench 116 is formed by a conventional trench mask etching process by etching through first oxide layer 114 and first metallic hardmask layer 112 and a portion of first sacrificial dielectric layer 110. A first organic planarization layer (OPL) 118 is then deposited in trench 116 using, e.g., a spin-on coating process. First OPL 118 fills the trench and is formed over the top surface of first oxide layer 114. The first OPL 118 can be a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, the first OPL 118 can include a transparent organic polymer. The OPL can be a standard CxHy polymer. Non-limiting examples of OPL materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

Second sacrificial dielectric layer 120 (e.g., a sacrificial nitride or oxide spacer) is then deposited over the top surface of first OPL 118. Second metallic hardmask layer 122 overlies second sacrificial dielectric layer 120, and a second oxide layer 124 overlies second metallic hardmask layer 122. Suitable materials for second metallic hardmask layer 122 can include any of those discussed above for first metallic hardmask layer 112. The second sacrificial dielectric layer 120, second metallic hardmask layer 122 and second oxide layer 124 may be formed using known deposition techniques, such as, for example, ALD, CVD, PECVD, PVD or spin on deposition, followed by a standard planarization process (e.g., CMP) to planarize the upper surfaces.

A second OPL 126 is formed over, and in contact with, first oxide layer 124. The OPL 126 can be a self-planarizing organic material as discussed above. An anti-reflective coating layer 128 is formed over, and in contact with OPL 126. The layer 128 may, for example, comprise silicon containing materials such as a SiARC coating as known to those skilled in the art. The OPL 126 and SiARC layer 128 can be applied by known techniques, for example, by spin-coating. In one embodiment, SiARC layer 128 can have a thickness ranging from about 10 to about 100 nm. In one embodiment, OPL layer 126 can have a thickness ranging from about 30 to about 300 nm.

Next, photoresist 130 is formed onto the SiARC layer 128 and is lithographically patterned to form a plurality of via openings 132 therein.

Figure 2:
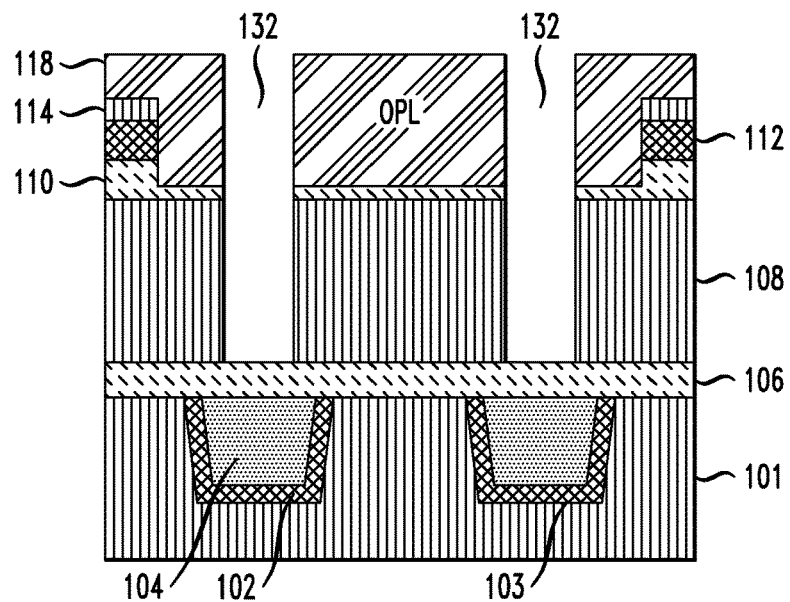
FIG. 2 is a cross-sectional view illustrating a BEOL semiconductor structure after further etching to extend the plurality of via openings in a method of manufacturing a semiconductor device, according to an exemplary embodiment of the present invention.

FIG. 2 illustrates the semiconductor structure 100 at an intermediate stage of fabrication after a further etching to extend the plurality of via openings 132 using the photoresist 130 as a guide. The etch may, for example, comprise a reactive ion etch (ME) as known to those skilled in the art. As shown in FIG. 2, the plurality of via openings 132 are extended through semiconductor structure 100 and expose the top surface of dielectric cap layer 106 in second insulating layer 108. The photoresist 130 is completely removed during the etching process. In addition, the remaining second sacrificial dielectric layer 120, second metallic hardmask layer 122, second oxide layer 124, OPL 126 and SiARC layer 128 are removed by known ME or wet etching techniques as shown in FIG. 2.

Figure 3:
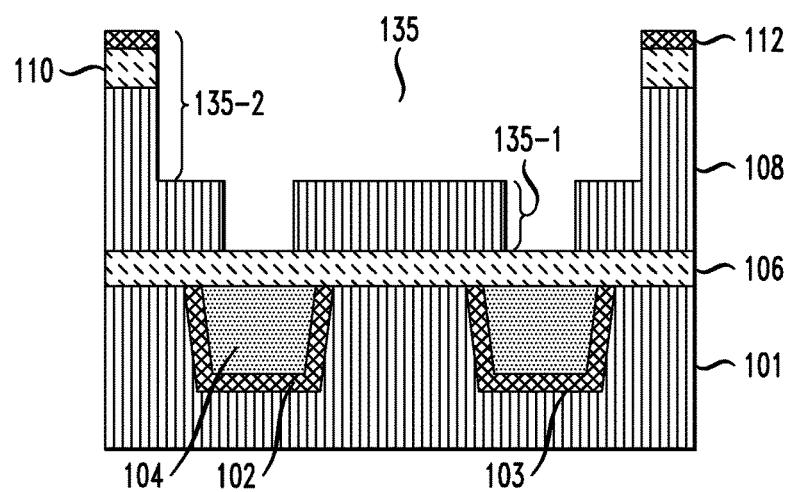
FIG. 3 is a cross-sectional view illustrating a BEOL semiconductor structure after trench formation in a method of manufacturing a semiconductor device, according to an exemplary embodiment of the present invention.

FIG. 3 illustrates the semiconductor structure 100 at an intermediate stage of fabrication wherein a trench and vias are formed, according to an embodiment of the invention. In particular, FIG. 3 schematically illustrates an intermediate step using any suitable etching technique that is commonly implemented for a "dual damascene" process, wherein both a via hole and a corresponding trench are formed in second insulating layer 108, i.e., an ILD layer, prior to filling both the via hole and trench with a single metallic material. The opening 135 comprises via holes 135-1 and a corresponding trench 135-2. In one embodiment of the invention, the opening 135 is formed by removing first OPL 118 by a standard $O_2$ or $N_2/H_2$ based OPL ash and then carrying out a conventional trench etching to remove a portion of second insulating layer 108. First oxide layer 114 is removed during the trench etch exposing the top surface of first metallic hardmask layer 112 to form opening 135 comprising a via hole 135-1 and a corresponding trench 135-2.

Figure 4:
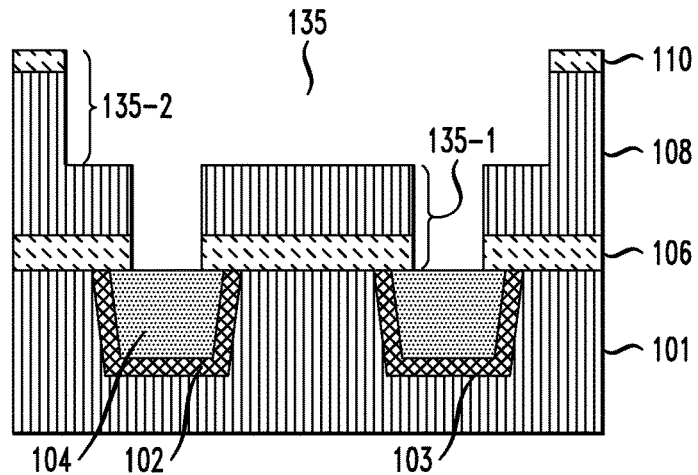
FIG. 4 is a cross-sectional view illustrating a BEOL semiconductor structure after dielectric cap layer removal from the via hole in a method of manufacturing a semiconductor device, according to an exemplary embodiment of the present invention.

FIG. 4 illustrates the semiconductor structure 100 at an intermediate stage of fabrication wherein dielectric cap layer 106 is removed from via hole 135-1 by, for example, RIE, to expose the top surface of the first metallic material 104 in via contact 103 and selectively removing first metallic hardmask layer 112 using, for example, a wet etch process.

Figure 5:
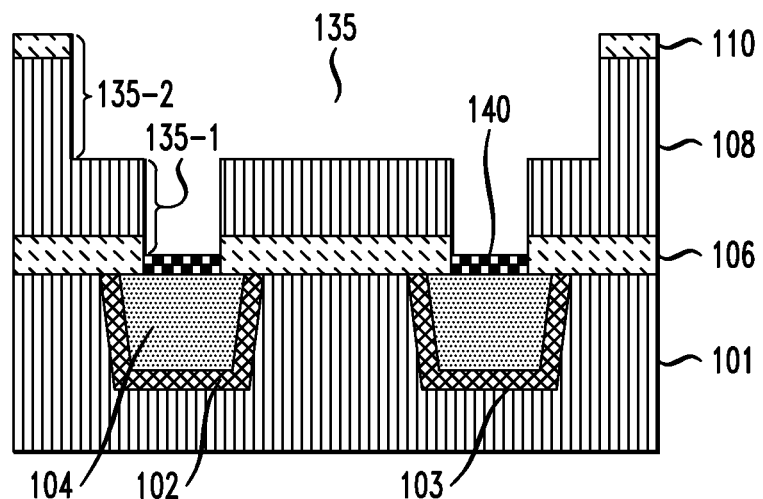
FIG. 5 is a cross-sectional view illustrating a BEOL semiconductor structure after self-assembled monolayer (SAM) deposition in the via hole in a method of manufacturing a semiconductor device, according to an exemplary embodiment of the present invention.

FIG. 5 illustrates the semiconductor structure 100 at an intermediate stage of fabrication wherein self-assembled monolayer (SAM) 140 is deposited on the top surface of the metallic material 104 in via contact 103 selective to other exposed surfaces of layers 106, 108 and 110. This selective deposition is enabled by suitable selection of SAM 140 which only attaches to metallic surface. The suitable material SAM 140 also advantageously prevents deposition of the barrier layer on the metallic material 104. In general, the SAM 140 will comprise a first functional group to anchor or bind the monolayer to the metallic material 104, and a second functional group for organometallic deactivation. In one embodiment, a SAM 140 comprises a thiol compound as a first functional group and having the formula: RSH wherein R is a linear or branched, substituted or unsubstituted, alkyl, alkenyl, cycloalkyl or aromatic containing from about 6 to about 25 carbon atoms. When substituted, the substituent may be an alkyl having from 1 to about 3 carbon atoms, a halogen such as Cl, Br, F or I, hydroxyl, ammonium and other like substituents. Suitable thiol compounds include, for example, 1-hexadecanthiol and 1-octadecane thiol. In one embodiment, a thiol includes those wherein R is an alkyl having from 16 to about 20 carbon atoms.

In another embodiment, a SAM 140 can include a phosphonic acid, a phosphonate group, an amine, phosphine, and isocyanide as a first functional group. For example, a SAM 140 may be one or more of diethyl (3-aminopropyl)phosphonate, diethyl(3-(pentacosa-10,12-diynamido)propyl) phosphonate, and (3-(pentacosa-10,12-diynamido)propyl) phosphonic acid. Examples of such SAMs can be seen in, for example, Wojtecki et al., "Reactive Monolayers in Directed Additive Manufacturing—Area Selective Atomic Layer Deposition," J. Photopolymer Science & Technology, (2018).

The SAM 140 can be deposited in via hole 135-1 on the top surface of the metallic material 104 in via contact 103 by techniques known in the art, e.g., spin coating. In one embodiment, the SAM 140 is formed by immersing the structure in a thiol-containing solution. The treatment process is carried out at room temperature for a time period of from about 0.1 to about 24 hours. If desired, elevated temperatures up to about 70° C. can also be used as long as the elevated temperature does not adversely effect the various layers of the structure. The SAM solution may be a concentrated solution or can be a diluted solution in which the SAM material such as a thiol compound is dissolved in a solvent such as ethanol or heptane. In one embodiment, a diluted solution containing from about 0.001 to about 0.01% SAM material is employed in forming the self-assembled monolayer. In one illustrative embodiment, the SAM 140 may have a thickness ranging from about 1 to about 20 nm.

Figure 6:
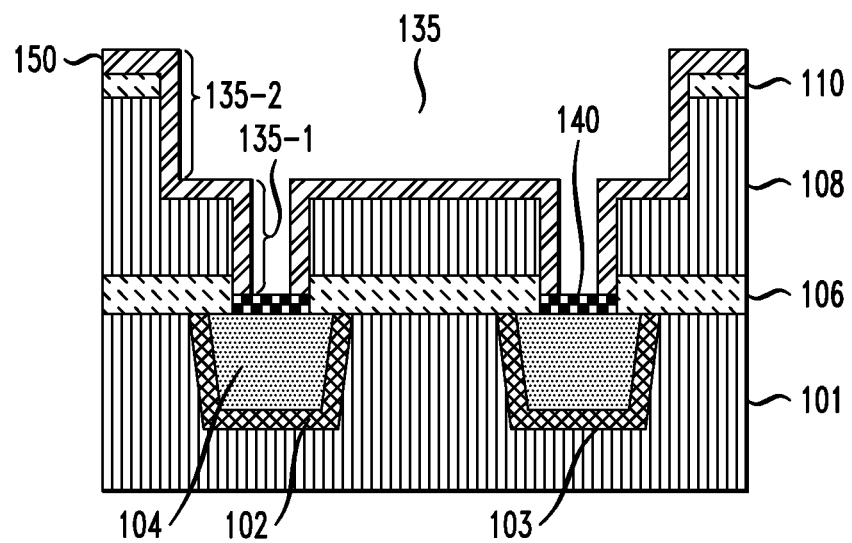
FIG. 6 is a cross-sectional view illustrating a BEOL semiconductor structure after barrier layer deposition in a method of manufacturing a semiconductor device, according to an exemplary embodiment of the present invention.

FIG. 6 illustrates the semiconductor structure 100 at an intermediate stage of fabrication wherein barrier layer 150 is deposited on the exposed surfaces of opening 135. In one embodiment, barrier layer 150 is deposited on the exposed surfaces of opening 135 and not on a top surface of SAM 140. The barrier layer 150 can comprise a metal-containing material such as, for example, TaN, TiN or Ru. In one illustrative embodiment, the barrier layer 150 may have a thickness ranging from about 1 to about 5 nm. The presence of SAM 140 prevents barrier layer 150 deposition on the metal surface 104 in via contact 103. The barrier layer 150 can be formed by a deposition process including, for example, CVD, PECVD, ALD, PVD, sputtering, chemical solution deposition and plating.

Figure 7:
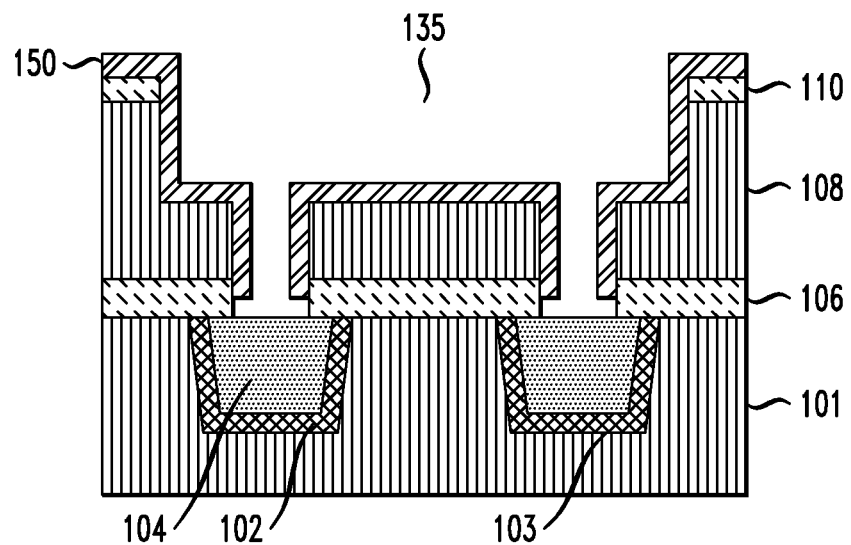
FIG. 7 is a cross-sectional view illustrating a BEOL semiconductor structure after SAM removal in a method of manufacturing a semiconductor device, according to an exemplary embodiment of the present invention.

FIG. 7 illustrates the semiconductor structure 100 at an intermediate stage of fabrication wherein SAM 140 is removed from via hole 135-1 to expose the top surface of the metallic material 104 in via contact 103. SAM 140 can be removed by conventional dry etching processes. For example, in one illustrative embodiment, SAM 140 is removed by a standard plasma etch using $N_2/H_2$ chemistry.

Figure 8:
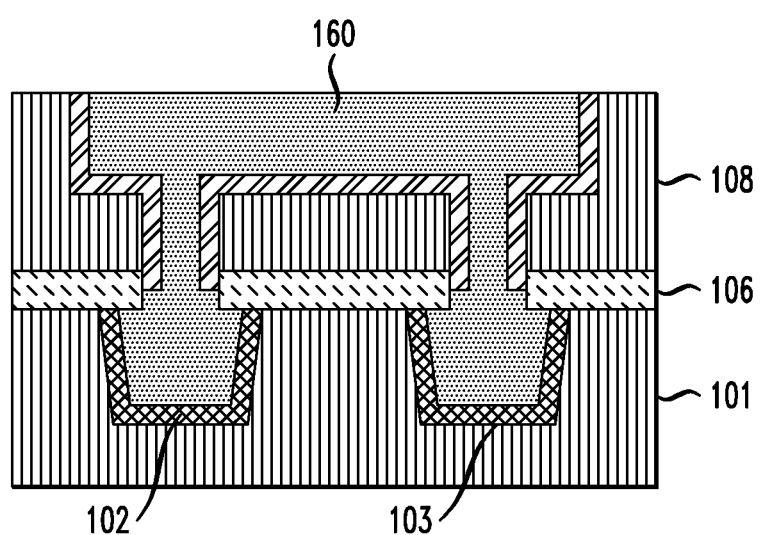
FIG. 8 is a cross-sectional view illustrating a BEOL semiconductor structure after metallic material deposition in a method of manufacturing a semiconductor device, according to an exemplary embodiment of the present invention.

FIG. 8 illustrates the semiconductor structure 100 at an intermediate stage of fabrication wherein second metallic material 160 is deposited in opening 135 to fill via hole 135-1 and trench 135-2. The second metallic material 160 can be any of the first metallic materials 104 discussed above for filling via contact 103. In addition, second metallic material 160 can be deposited by any known method such as ALD, CVD, and PVD. A CMP process is performed to remove the overburden of the metallic material used to fill the opening, and to planarize the structure. Accordingly, a barrier free contact is thus formed between second metallic material 160 and first metallic material 104 in the resulting semiconductor structure 100.

Figure 9:
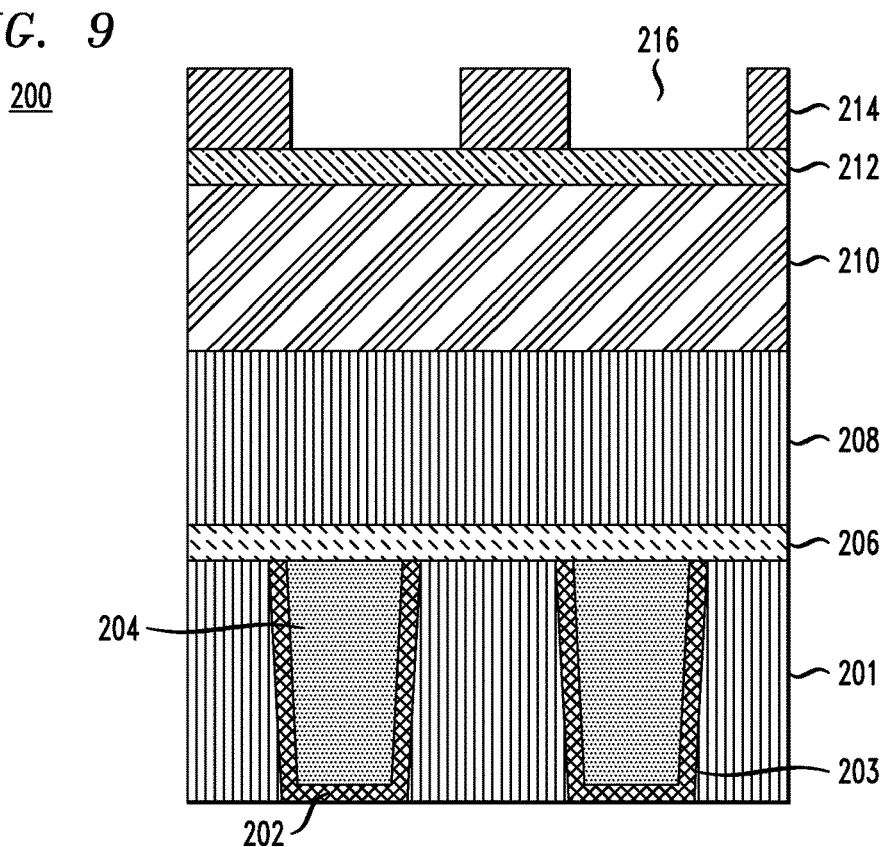
FIG. 9 is a cross-sectional view illustrating a MOL semiconductor structure for use in a method of manufacturing a semiconductor device, according to another exemplary embodiment of the present invention.

According to another embodiment, FIG. 9 illustrates a schematic cross-sectional side view of a semiconductor structure 200 for use in forming a barrier free contact for MOL metal interconnects in a semiconductor structure. For the purpose of clarity, several fabrication steps leading up to the production of semiconductor structure 200 as illustrated in FIG. 9 are omitted. In other words, semiconductor structure 200 does not necessarily start out in the form illustrated in FIG. 9, but may develop into the illustrated structure over one or more well-known processing steps which are not illustrated but are well-known to those of ordinary skill in the art.

As shown in FIG. 9, the semiconductor structure 200 comprises an insulating layer 201. Insulating layer 201 can be formed on, for example, a semiconductor substrate (not shown) comprising a semiconductor material including, but not limited to, silicon (Si), silicon germanium (SiGe) at various Si and Ge concentrations, silicon carbide (SiC), Si:C (carbon doped silicon), silicon germanium carbide (SiGeC), carbon doped silicon germanium (SiGe:C), compound semiconductor materials (e.g. Groups III-V), or other like semiconductor material. In addition, multiple layers of the semiconductor materials can be used as the semiconductor material of the substrate. The semiconductor substrate can be a bulk substrate or a semiconductor-on-insulator substrate such as, but not limited to, a silicon-on-insulator (SOI), silicon-germanium-on-insulator (SGOI) or Groups III-V-on-insulator substrate including a buried insulating layer, such as, for example, a buried oxide, nitride layer or aluminum oxide.

Insulating layer 201 includes any suitable low-k dielectric material as discussed above for first insulating layer 101. Insulating layer 201 further includes via contacts 203 formed in at least a portion of insulating layer 201. Via contacts 203 have a diffusion barrier/liner layer 202 formed on the sidewalls and bottom surface of insulating layer 201 and is filled with a first metallic material 204.

In one embodiment, the via contacts 203 are formed by etching a via hole in at least a portion of first insulating layer 201, lining the via hole with a diffusion barrier/liner layer 202 (e.g., TiN, TaN, Ru, etc.), and filling the via hole with a first metallic material 204 such as Co, Al, W or Cu. The diffusion barrier/liner material and metallic material can be conformally deposited using known methods such as ALD, CVD, PVD, electroplating, or electroless plating. A CMP process is performed to remove the overburden of the diffusion barrier/liner material and metallic material used to fill the via hole, and to planarize the structure surface prior to deposition of the dielectric cap layer.

A first dielectric cap layer 206 (e.g., a sacrificial nitride spacer) overlies the top surface of first insulating layer 201 and via contacts 203. The first dielectric cap layer 206 may be formed using known deposition techniques, such as, for example, CVD, PVD, PECVD, ALD, or spin on deposition, followed by a standard planarization process (e.g., CMP) to planarize the upper surface. In one embodiment, first dielectric cap layer 206 can have a thickness ranging from about 40 to about 200 nm.

An oxide layer 208 overlies sacrificial spacer layer 206. The oxide layer 208 may be formed using known deposition techniques, such as, for example, ALD, CVD, PECVD, PVD or spin on deposition, followed by a standard planarization process (e.g., CMP) to planarize the upper surface. In one embodiment, oxide layer 208 can have a thickness ranging from about 40 to about 200 nm.

An OPL 210 is formed over, and in contact with, oxide layer 208. The OPL 210 can be a self-planarizing organic material as discussed above. An anti-reflective coating layer 212 is formed over, and in contact with OPL 210. The layer 212 may, for example, comprise silicon containing materials such as a SiARC coating as known to those skilled in the art. The OPL 210 and SiARC layer 212 can be applied by known techniques, for example, by spin-coating. In one embodiment, OPL layer 210 can have a thickness ranging from about 30 to about 300 nm. In one embodiment, SiARC layer 212 can have a thickness ranging from about 10 to about 100 nm.

Next, photoresist 214 is formed onto the SiARC layer 212 and is lithographically patterned to form a plurality of via openings 216 therein.

Figure 10:
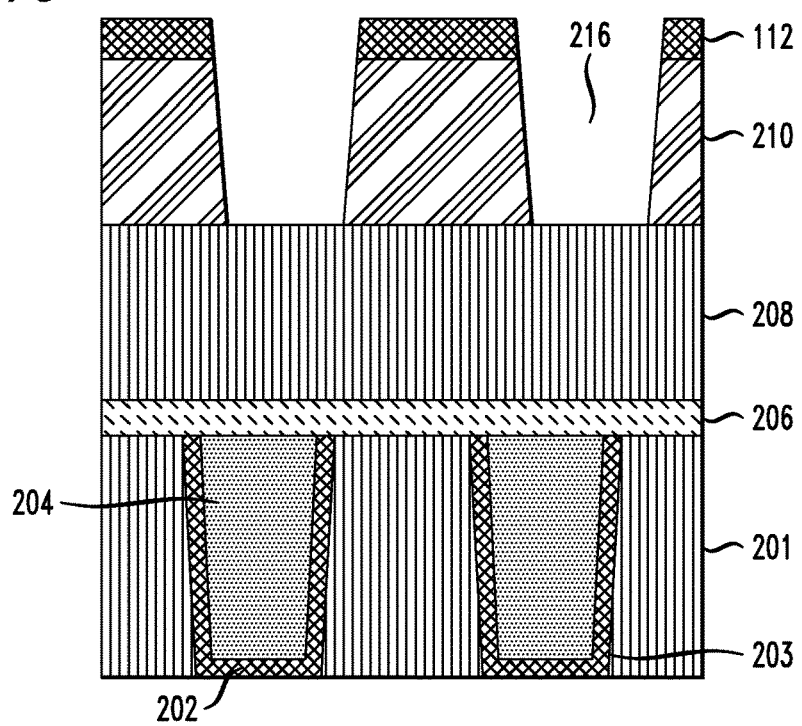
FIG. 10 is a cross-sectional view illustrating a MOL semiconductor structure after further etching to extend the plurality of via openings in a method of manufacturing a semiconductor device, according to an exemplary embodiment of the present invention.

FIG. 10 illustrates the semiconductor structure 200 at an intermediate stage of fabrication after a further etching to extend the plurality of via openings 216 using the photoresist 214 as a guide. The etch may, for example, comprise a RIE as known to those skilled in the art. As shown in FIG. 10, the plurality of via openings 216 are extended through semiconductor structure 200 and exposing the top surface of oxide layer 208 in OPL 210. The photoresist 214 is removed during the etching process, as shown in FIG. 10.

Figure 11:
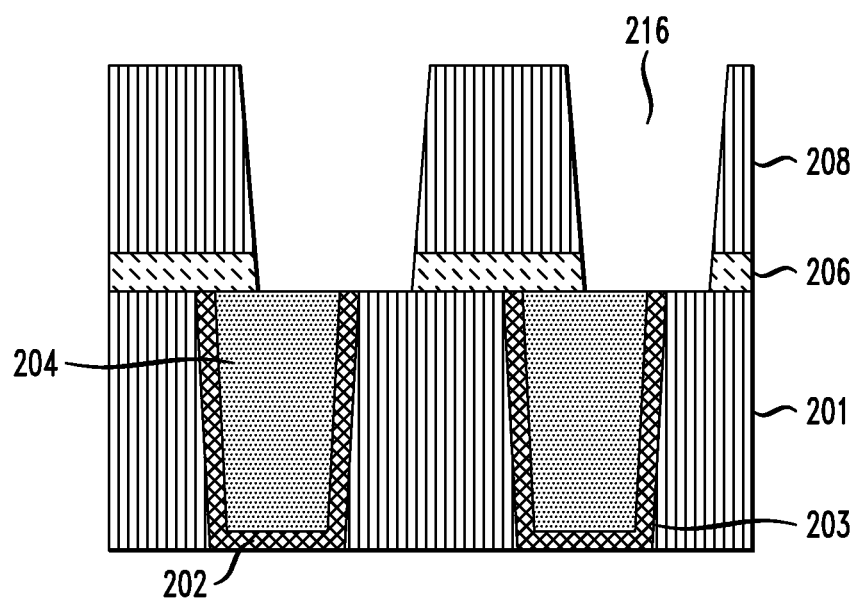
FIG. 11 is a cross-sectional view illustrating a MOL semiconductor structure after further etching to extend the plurality of via openings in a method of manufacturing a semiconductor device, according to an exemplary embodiment of the present invention.

FIG. 11 illustrates the semiconductor structure 200 at an intermediate stage of fabrication after a further etching to extend the plurality of via openings 216 through oxide layer 208 and dielectric cap layer 206. The etch may, for example, comprise a fluorocarbon (e.g., a $C_4F_6$ etch, $C_4F_8$ etch, $CH_2F_2$ etch, $CHF_3$ etch, $CF_4$ etch, etc.) based RIE as known to those skilled in the art. During this etch, the SiARC layer 212 is also removed, since fluorocarbon chemistry etches SiARC. The remaining OPL layer 210 is then removed by a standard RIE using $O_2$ chemistry. As shown in FIG. 11, the plurality of via openings 216 are extended through oxide layer 208 and expose at least a portion of the top surfaces of metallic material 204 in via contact 203 and first insulating layer 201. The OPL 210 is then removed by known techniques, as shown in FIG. 11.

Figure 12:
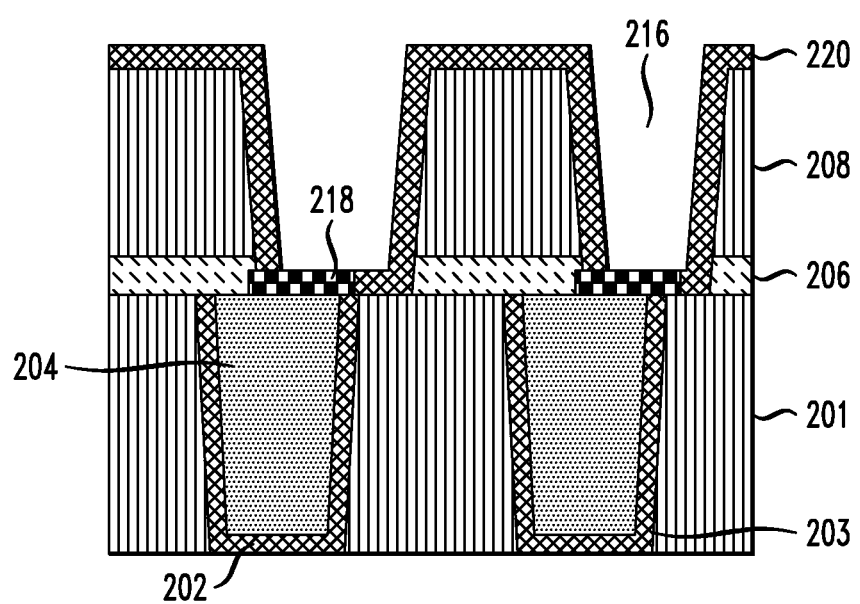
FIG. 12 is a cross-sectional view illustrating a MOL semiconductor structure after SAM and barrier layer deposition in the via hole in a method of manufacturing a semiconductor device, according to an exemplary embodiment of the present invention.

FIG. 12 illustrates the semiconductor structure 200 at an intermediate stage of fabrication wherein SAM 218 is deposited on the top surface of the exposed top surface of first metallic material 204 in via contacts 203 selective to other exposed dielectric surfaces of layers 201, 206 and 208. This selective deposition is achieved by suitable selection of SAM 218 which only attaches to the metallic surface. The suitable material for SAM 218 also prevents deposition of the barrier layer on the first metallic material 204 in via contacts 203. In general, the SAM 218 can comprise any material as discussed above for SAM 140. The SAM 218 can be deposited in via openings 216 and on the exposed top surface of first metallic material 204 in via contacts 203 by techniques known in the art, e.g., spin coating. In one embodiment, the SAM 218 is formed by immersing the structure in a thiol-containing solution. The treatment process can be carried out as discussed above for SAM 140. In one illustrative embodiment, the SAM 218 may have a thickness ranging from about 1 to about 20 nm.

Next, barrier layer 220 is deposited on the exposed surfaces of opening 216, oxide layer 208 and insulating layer 201. The barrier layer 220 can comprise a metal-containing material as discussed above for barrier layer 150. In one embodiment, barrier layer 220 is TiN. The barrier layer 220 can be formed by a deposition process including, for example, CVD, PECVD, ALD, PVD, sputtering, chemical solution deposition and plating. The thickness of barrier layer 220 can range from about 1 to about 5 nm. In addition, the presence of SAM 218 prevents barrier layer deposition on the surface of first metallic material 204 in via contact 203.

Figure 13:
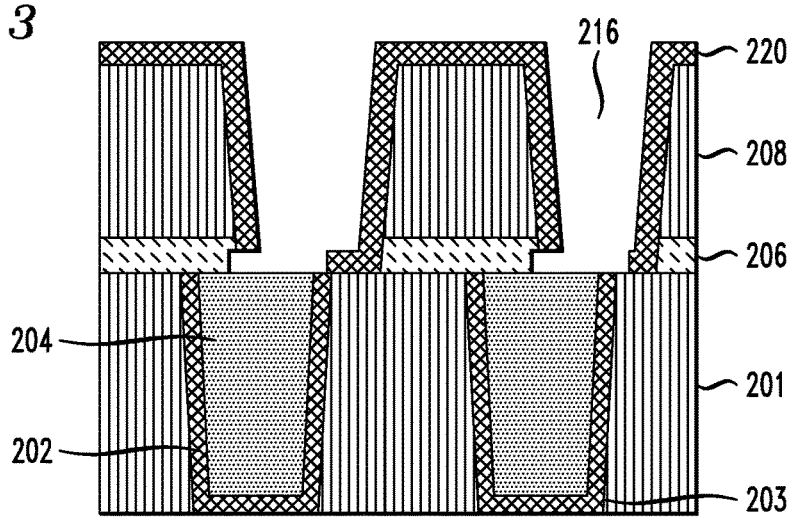
FIG. 13 is a cross-sectional view illustrating a MOL semiconductor structure after SAM layer removal in a method of manufacturing a semiconductor device, according to an exemplary embodiment of the present invention.

FIG. 13 illustrates the semiconductor structure 200 at an intermediate stage of fabrication wherein SAM 218 is removed from opening 216 to expose the top surface of the metallic material 204 in via contact 203 and a portion of sidewalls of dielectric cap layer 206 under the barrier layer 220. SAM 218 can be removed by conventional dry or wet etching processes. For example, in one illustrative embodiment, SAM 218 is removed by a plasma etch using standard $N_2/H_2$ chemistry.

Figure 14:
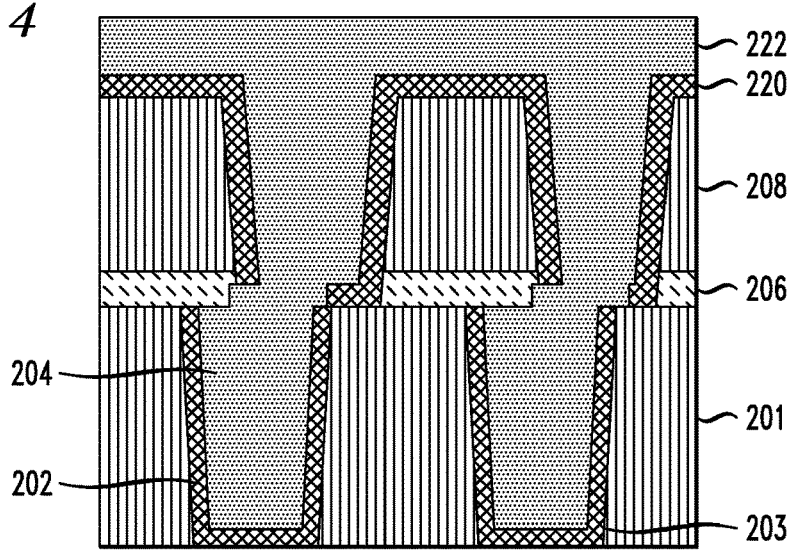
FIG. 14 is a cross-sectional view illustrating a MOL semiconductor structure after metallic material deposition in a method of manufacturing a semiconductor device, according to an exemplary embodiment of the present invention.
Figure 15:
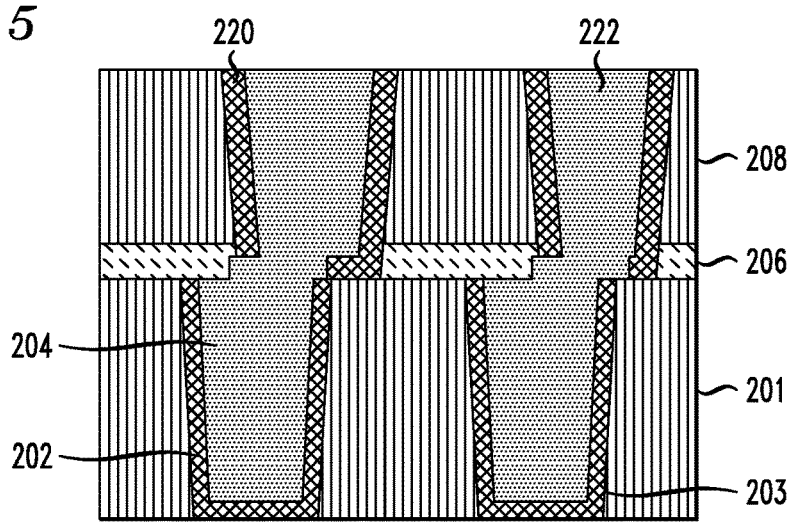
FIG. 15 is a cross-sectional view illustrating a MOL semiconductor structure after planarization of the metallic material in a method of manufacturing a semiconductor device, according to an exemplary embodiment of the present invention.

FIG. 14 illustrates the semiconductor structure 200 at a stage of fabrication wherein second metallic material 222 is deposited in and fills opening 216. The second metallic material 222 can be any of the first metallic materials 204 discussed above for filling via contact 203. In addition, second metallic material 222 can be deposited by any known method such as ALD, CVD, and PVD. A CMP process is performed to remove the overburden of the metallic material 222 used to fill the opening 216, and to planarize the structure as shown in FIG. 15. Accordingly, a barrier free contact is thus formed between second metallic material 222 and first metallic material 204 in the resulting semiconductor structure 200.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method for fabricating a semiconductor device, comprising:
    forming a first insulating layer having one or more vias formed in at least a portion of the first insulating layer, wherein the one or more vias are filled with a first metallic material;
    forming a cap layer on a top surface of the first insulating layer and a top surface of the one or more vias formed in at least a portion of the first insulating layer;
    forming a second insulating layer on a top surface of the cap layer;
    forming a sacrificial dielectric layer on the second insulating layer;
    forming a dual damascene structure having a trench in an upper portion and vias extending from the trench in a lower portion of the sacrificial dielectric layer, the second insulating layer and the cap layer and exposing at least a portion of a top surface of the first metallic material in the vias;
    forming a self-assembled monolayer of a material on the exposed top surface of the first metallic material in the vias;
    forming a metal-containing barrier layer on an exposed surface of the dual damascene structure and a portion of the self-assembled monolayer to expose a top surface of the self-assembled monolayer;
    removing the self-assembled monolayer to expose the top surface of the first metallic material in the vias; and
    filling the vias and the trench with a second metallic material, wherein the second metallic material is in contact with the first metallic material;
    wherein the semiconductor device is formed as part of a back-end-of-line (BEOL) structure or as part of a middle-of-line (MOL) structure.

2. The method according to claim 1, wherein the first insulating layer comprises a low-k dielectric material.

3. The method according to claim 1, wherein the vias in the first insulating layer further comprise another barrier layer formed on sidewalls of the vias and an exposed surface of the first insulating layer.

4. The method according to claim 3, wherein the other barrier layer comprises one or more of titanium nitride, tantalum nitride and ruthenium.

5. The method according to claim 1, wherein the first metallic material is selected from the group consisting of aluminum, tungsten, copper and cobalt.

6. The method according to claim 1, wherein the self-assembled monolayer comprises one or more of a thiol group, a phosphonic acid group and a phosphonate group.

7. The method according to claim 1, wherein the step of removing the self-assembled monolayer comprises a plasma etch using $N_2/H_2$ chemistry.

8. The method according to claim 1, wherein the first insulating layer and the second insulating layer independently comprises an ultra low-k dielectric material.

9. The method according to claim 1, wherein the first metallic material and the second metallic material are the same metallic material.

10. The method according to claim 1, wherein the first metallic material and the second metallic material are copper.

11. The method according to claim 1, wherein the first metallic material and the second metallic material are cobalt.

12. A semiconductor structure comprising:
   a first insulating layer having one or more vias in at least a portion of the first insulating layer, wherein the one or more vias contain a first metallic material;
   a cap layer disposed on a top surface of the first insulating layer and a top surface of the one or more vias;
   a second insulating layer disposed on a top surface of the cap layer;
   a sacrificial dielectric layer disposed on the second insulating layer;
   a dual damascene structure having a trench in an upper portion and vias extending from the trench in a lower portion of the sacrificial dielectric layer, the second insulating layer and the cap layer and configured to expose at least a portion of a top surface of the first metallic material in the one or more vias;
   a self-assembled monolayer of a material disposed on an exposed top surface of the first metallic material in the vias;
   a metal-containing barrier layer disposed on an exposed surface of the dual damascene structure and a portion of the self-assembled monolayer and configured to expose a top surface of the self-assembled monolayer; and
   a second metallic material disposed in and filling the vias and the trench, wherein the second metallic material is in contact with the first metallic material;
   wherein the semiconductor structure comprises one of a BEOL structure or a MOL structure.

13. The semiconductor structure according to claim 12, wherein the first metallic material is selected from the group consisting of aluminum, tungsten, copper and cobalt.

14. The semiconductor structure according to claim 12, wherein the self-assembled monolayer comprises one or more of a thiol group, a phosphonic acid group and a phosphonate group.

15. The semiconductor structure according to claim 12, wherein the first insulating layer and the second insulating layer independently comprises an ultra low-k dielectric material.

16. The semiconductor structure according to claim 12, wherein the first metallic material and the second metallic material are the same metallic material.

17. The semiconductor structure according to claim 12, wherein the vias in the first insulating layer further comprise another barrier layer formed on sidewalls of the vias and an exposed surface of the first insulating layer.

18. The semiconductor structure according to claim 17, wherein the other barrier layer comprises one or more of titanium nitride, tantalum nitride and ruthenium.

19. The semiconductor structure according to claim 12, wherein the first metallic material and the second metallic material are copper.

20. The semiconductor structure according to claim 12, wherein the first metallic material and the second metallic material are cobalt.

* * * * *